United States Patent
Don

(10) Patent No.: US 11,444,700 B2
(45) Date of Patent: Sep. 13, 2022

(54) ANTENNA RADIATION PATTERN COMPRESSIVE SENSING

(71) Applicant: CCDC Army Research Laboratory, Adelphi, MD (US)

(72) Inventor: Michael L. Don, Baltimore, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 328 days.

(21) Appl. No.: 16/591,982

(22) Filed: Oct. 3, 2019

(65) Prior Publication Data
US 2021/0105075 A1  Apr. 8, 2021

(51) Int. Cl.
*H04B 17/10* (2015.01)
*G01R 29/10* (2006.01)

(52) U.S. Cl.
CPC ........... *H04B 17/102* (2015.01); *G01R 29/10* (2013.01)

(58) Field of Classification Search
CPC ....... H04B 17/102; H04B 17/12; G01R 29/10
See application file for complete search history.

(56) References Cited

U.S. PATENT DOCUMENTS

| | | | |
|---|---|---|---|
| 10,536,226 B1* | 1/2020 | Huynh | H04B 17/391 |
| 2013/0315081 A1* | 11/2013 | Kim | H04B 7/0486 |
| | | | 370/252 |
| 2016/0028447 A1* | 1/2016 | Etkin | H04B 7/024 |
| | | | 455/561 |
| 2018/0080967 A1* | 3/2018 | Lee | G01R 29/10 |
| 2018/0159638 A1* | 6/2018 | Awadin | H04B 17/17 |

OTHER PUBLICATIONS

M. Rani et al., "A Systemic Review of Compressive Sensing: Concepts, Implementations and Applications", IEEE Access, Feb. 28, 2018, vol. 6, pp. 4875-4894.
P. Debroux et al., "Compressive Sensing Reconstruction of Wideband Antenna Radiation Characteristics", Progress In Electromagnetics Research C, vol. 73, pp. 1-8, 2017.
Don, Michael L. and Gonzalo R. Arce "Antenna Radiation Pattern Compressive Sensing" presented at MILCOM 2018-2018 IEEE Military Communications Conference and added to IEEE Xplore Jan. 3, 2019.

* cited by examiner

*Primary Examiner* — Alvaro E Fortich
(74) *Attorney, Agent, or Firm* — Christos S. Kyriakou

(57) ABSTRACT

A method and apparatus for measuring antenna radiation patterns comprising: an array of test antennas coupled to at least one transmitter; an antenna under test located proximate to the array of test antennas and a compressive sensing processor coupled to the antenna under test and the array of test antennas to control signals emitted and received by the antenna under test and the array of test antennas and processing the signals using compressive sensing.

26 Claims, 8 Drawing Sheets

TABLE I
A COMPARISON OF TRADITIONAL MEASUREMENT METHODS

|  | TS | TC | TP |
|---|---|---|---|
| Transmitters | $n_\theta n_\varphi$ | $n_\theta$ | 1 |
| Samples | $n_\theta n_\varphi$ | $n_\theta n_\varphi$ | $n_\theta n_\varphi$ |
| Movements | 0 | $n_\varphi$ | $n_\theta n_\varphi$ |
| Total Time | $n_\theta n_\varphi t_s$ | $n_\varphi(n_\theta t_s + t_m)$ | $n_\theta n_\varphi(t_s + t_m)$ |

TABLE II
A COMPARISON OF CS MEASUREMENT METHODS

|  | IS | RS | IC | RC |
|---|---|---|---|---|
| Trans. | $n_\theta n_\varphi$ | $n_\theta n_\varphi r_n$ | $n_\theta$ | $n_\theta$ |
| Samp. | $n_\theta n_\varphi r_m$ | $n_\theta n_\varphi r_m$ | $n_\theta n_\varphi r_m$ | $n_\theta n_\varphi r_m$ |
| Mov. | 0 | $n_\theta$ | $n_\varphi$ | $n_\theta n_\varphi$ |
| Time | $n_\theta n_\varphi r_m t_s$ | $n_\theta n_\varphi r_m t_s + n_\theta t_m$ | $n_\theta n_\varphi r_m t_s + n_\varphi t_m$ | $n_\theta n_\varphi r_m t_s + n_\theta n_\varphi t_m$ |

TABLE III
A COMPARISON OF THE METHODS WITH EXAMPLE VALUES

|  | TS | TC | TP | IS | RS | IC | RC |
|---|---|---|---|---|---|---|---|
| Trans. | 2048 | 64 | 1 | 2048 | 32 | 64 | 32 |
| Samp. | 2048 | 2048 | 2048 | 512 | 640 | 256 | 128 |
| Mov. | 0 | 32 | 2048 | 0 | 64 | 32 | 128 |
| Time (s) | 205 | 301 | 6349 | 51 | 256 | 122 | 397 |

ANTENNA RADIATION PATTERN COMPRESSIVE SENSING

GOVERNMENT INTEREST

The invention described herein may be manufactured, used, and licensed by or for the United States Government.

BACKGROUND

Field

Embodiments of the present invention generally relate to antennas and, more particularly, to techniques for measuring antenna patterns.

Description of the Related Art

Modern wireless communications are placing ever greater demands on communication system antennas. Ultra-wide band communications and ranging, cognitive radio, and low probability of intercept applications require high antenna performance across a greater range of wavelengths than traditional, narrowband radio. Beamforming applications require complex antenna arrays. Many direction of arrival systems require a precise characterization of the antenna radiation pattern (ARP) for optimal performance. Unfortunately, ARP measurement is an expensive, time consuming process, especially when performed over a range of wavelengths.

A simple antenna pattern measurement system consists of a transmitter, an antenna under test (AUT), a two-stage rotation platform to adjust azimuth and elevation, and a device to compare the AUT's phase and amplitude to a reference signal. In a traditional sampling technique, the gain and phase are measured (sampled) as the AUT is rotated through every azimuth and elevation position for each wavelength of interest. The rotation and measurement process requires an excessive amount of time, e.g., eight to fifteen hours for a typical antenna.

Inpainting is an ARP measurement technique that is similar to traditional sampling. It is commonly used in image processing to fill in missing parts of an image. In the context of ARP measurement, the pattern can be purposely sub-sampled, recovering the missing samples through inpainting. Unlike traditional sampling, the samples are not required to be evenly spaced, allowing more flexibility in the sampling process. Although inpainting can produce high quality results for data with low frequency content, it can be inaccurate if the sub-samples miss small features in the data.

Meanwhile, over the last decade a new technique has emerged stimulating a great amount of research in the signal processing community. Compressive sensing (CS) has been touted as the sampling paradigm of the future, enabling higher performance in areas such as signal resolution, system power, and measurement speed. But CS is not well suited to every application. In order to exploit the full benefits of CS, four criteria should be met. First, the data must be sufficiently sparse. Although many signals are naturally sparse, higher-dimensional data is typically extremely sparse, significantly improving CS performance. Second, current standard measurement costs must be very high in order to make the additional costs of specialized CS hardware worthwhile. Third, precise knowledge of the measurement environment is required to recover the data from the compressed samples. A controlled laboratory setting would be an ideal environment. And fourth, there should be sufficient time and computing power available to run the computationally intensive data recovery algorithms. It is possible to use CS without meeting these requirements, but significant design challenges would have to be overcome for the system to be practically viable. ARP measurement also meets these requirements: 2D ARP data taken over multiple wavelengths can be very sparse, measurement facilities are expensive, measurements are generally taken in a controlled environment, and the compressive measurements can easily be post-processed with a powerful computer.

Therefore, there is a need in the art to utilize compressive sensing in generating antenna radiation patterns.

SUMMARY OF THE INVENTION

Embodiments of the invention include a method and apparatus for generating antenna radiation patterns using compressive sensing (CS). The apparatus comprises at least a ring of transmitters circumscribing an antenna under test (AUT). The transmitters and the AUT are coupled to a CS processor. The CS processor controls the transmitters and gathers signal samples from the AUT. The CS processor generates an ARP for the AUT through CS processing of signal samples.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 12 presents Tables I, II and III.

DETAILED DESCRIPTION

In the detailed description that follows, the term frequency can refer to the oscillation of electromagnetic waves, or the coefficients of data in a frequency basis. To avoid confusion, the term "wavelength" is used when referring to electromagnetic waves, while "frequency" is used to refer to data. In addition, θ and φ are used as both angles and matrix indices; their use will be clear from the context.

Figure 1:
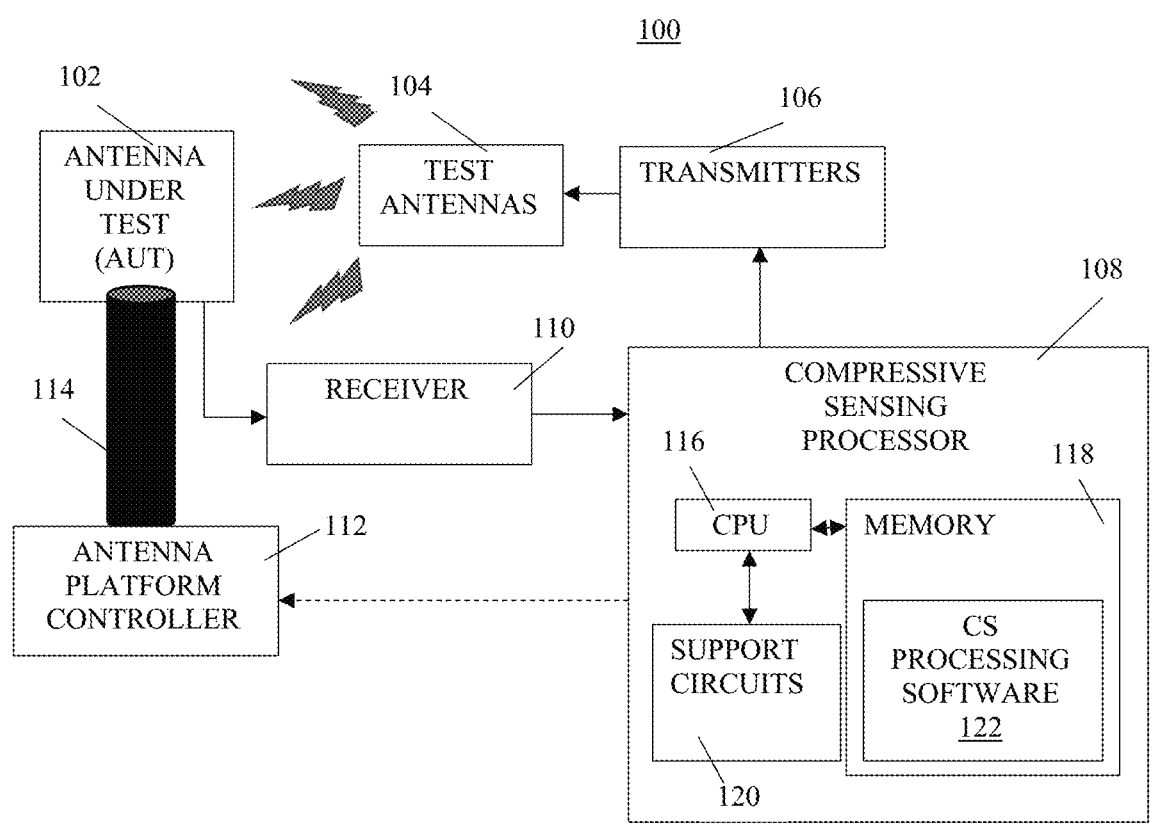
FIG. 1 is a block diagram of an embodiment of the invention comprising an antenna radiation pattern measurement system.

FIG. 1 is a block diagram of an embodiment of the invention comprising a antenna radiation pattern (ARP) measurement system 100. The ARP measurement system 100 comprises an antenna under test (AUT) 102 centrally located in an array of test antennas 104. The test antennas 104 are coupled to individual transmitters 106. The AUT 102 and the transmitters 106 are coupled to a compressive sensing (CS) processor 108 such that the CS processor 108 controls activation and operational parameters of the transmitters 106 as well as gathers received signals from the AUT 102 via a receiver 110. The CS processor 108 uses CS techniques to process the AUT signals to generate an ARP for the AUT 102.

In some embodiments, as described below, the AUT 102 does not need to be rotated. In other embodiments it does need to be rotated during testing. As such, an AUT mounting platform 114 and antenna platform controller 112 are shown. The controller 112 is controlled by the CS processor 108 to ensure the platform is positioned correctly for each measurement.

FIG. 1 further depicts a block diagram of one embodiment of the CS processor 108. The processor 108 comprises at least one central processing unit (CPU) 116 that is capable of performing the CS signal processing described below. Such a CPU 116 may include one or more microprocessors, gate arrays, microcontrollers, and the like. Functionality of the CPU 116 is supported by support circuits 120 that may include power supplies, clock circuits, input/output circuit(s), analog to digital converter(s), filters and other well-known support circuits. The support circuits may provide sampling, filtering or other pre-processing of the signals received by the test antennas 104. A memory 118 (also referred to as a computer readable medium) stores CS processing software 122 that is executed by the CPU 116. The memory may comprise a combination of random access memory, read only memory, removable storage, hard drive storage, solid state storage, and the like. The software 122 specifically comprises CS processing software that, when executed by the CPU 116, performs the CS processing of the signals received by the test antennas 104 as described below with reference to FIGS. 2-10.

Although, throughout this description, the AUT 102 is defined as being a receiving antenna and the test antennas 104 are described as being transmitting antennas, those skilled in the art will understand that the reverse arrangement could be used—the AUT 102 may be a transmitting antenna and the test antennas 104 may be receiving antennas.

Unlike traditional sampling or inpainting, whose performance depends on the frequency content of the data, CS performance only depends on the data's sparsity. This makes CS a favorable choice for the many types of signals that exhibit natural sparsity, such as antenna patterns.

The sampling of data $x \in \mathbb{R}^{n \times 1}$ to produce measurements $y \in \mathbb{R}^{m \times 1}$ can be represented as $$y = Ax, \quad (1)$$

where $A \in \mathbb{R}^{m \times n}$ is the sensing matrix. In standard sampling, the number of measurements is the same as the size of the data, and A is a n×n identity matrix. In compressive sensing, the sensing matrix elements are selected from random, or pseudo-random distributions, and typically m is significantly smaller than n. The compressive sample, then, is a randomly weighted sum of the data. Representing the data in a sparse basis $\Psi \in \mathbb{R}^{n \times n}$ with coefficients s, then (1) becomes $$y = A\Psi s, \quad (2)$$

where $x = \Psi s$. Given y (the measured results from an antenna under test), and A, an antenna radiation pattern can be generated. The coefficients are recovered through $\ell_1$ minimization with equality constraints $$\min \|s\|_1 \text{ subject to } y = A\Psi s. \quad (3)$$

Random sensing matrices have a low mutual-coherence μ, defined as the maximum coherence value $\mu_{ij}$, where $$\mu_{ij} = \frac{|d_i^T d_j|}{\|d_i\| \|d_j\|}, \quad 1 \leq i, j \leq N \text{ and } i \neq j. \quad (4)$$

In other words, μ is the largest absolute and normalized inner product between the columns in $D = A\Psi$. The minimum number of measurements required to recover the original data is $$m \geq C\mu^2 \|s\|_0 \log n, \quad (5)$$

where C is a positive constant and $\|s\|_0$ is the $\ell_0$ norm, i.e. the number of nonzero values in s.

By vectorizing multi-dimensional data and using complex values to represent the phase and amplitude of the signals, the CS measurements for a single wavelength are represented by equation (2). Typically, complex numbers are handled by converting them to real values as $$A' = \begin{pmatrix} \mathfrak{R}\{A\} & -\mathfrak{I}\{A\} \\ \mathfrak{I}\{A\} & \mathfrak{R}\{A\} \end{pmatrix} \quad (6)$$

$$x' = \begin{pmatrix} \mathfrak{R}\{x\} \\ \mathfrak{I}\{x\} \end{pmatrix}, \quad y' = \begin{pmatrix} \mathfrak{R}\{y\} \\ \mathfrak{I}\{y\} \end{pmatrix}. \quad (7)$$

Ψ is usually applied in the optimization process functionally, rather than calculated explicitly. Measurements at multiple wavelengths can be performed separately or at the same time, separating the measurements in the frequency domain, and then concatenating them into a single y vector and A matrix for data recovery. With this overview established, four different antenna pattern CS measurement architectures are described below.

Independent Spherical Measurements

Figure 2:
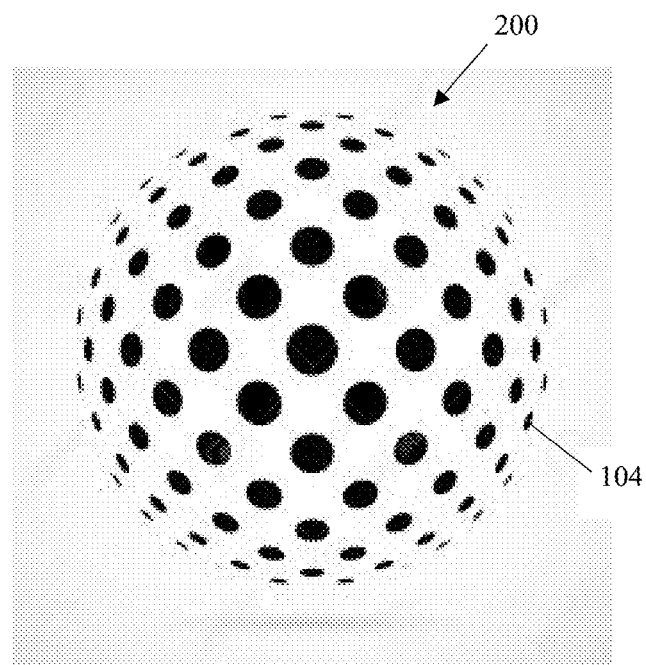
FIG. 2 is a schematic drawing of an embodiment of the invention where a plurality of test transmitter antennas are arranged in a sphere about the AUT and the AUT is static during measurements.
Figure 3:
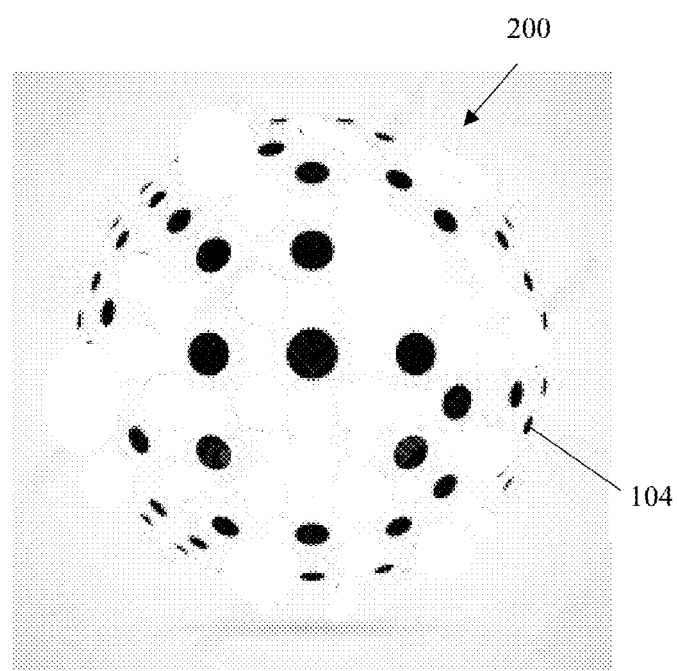
FIG. 3 is a schematic drawing of an embodiment of the invention where a plurality of test transmitter antennas are arranged in a sparse sphere about the AUT and the AUT is rotated between measurements.

The simplest scenario, although requiring the most resources, is to use a sphere of test antennas 104 all simultaneously transmitting signals with random phases and amplitudes. FIG. 2 schematically depicts the spherical antenna arrangement 200—the AUT 102 is positioned within a sphere of test antennas 104 (for clarity, not shown in FIG. 2). Each test antenna 104 is coupled to a transmitter (as shown in FIG. 1). The received signals are summed by the AUT 102 located at the center of the test antenna array and measured, creating a compressed signal. Note that this process can be reversed for reciprocal antennas, with the AUT transmitting to test antennas which scale and sum the received signals to create a compressed signal.

Starting with a single wavelength, the sensing matrix is $$A_\lambda = \begin{pmatrix} vec(F_\alpha)^T \\ \vdots \\ vec(F_\beta)^T \end{pmatrix} \lambda = 1, \ldots, n_\lambda \qquad (8)$$

$$\alpha = \frac{m}{n_\lambda}(\lambda+1)+1, \beta = \frac{m\lambda}{n_\lambda} \qquad (9)$$

where $\lambda$ indexes the range of $n_\lambda$ wavelengths, $F_k \in \mathbb{C}^{n_\theta \times n_\varphi}$ represents the amplitude and phases of the transmitting antennas as complex values during measurement k, m is the total number of measurements, and vec( ) is a vectorization operator. The complete sensing matrix for all wavelengths concatenates the $A_\lambda$ submatrices into a block diagonal matrix $$A = \begin{pmatrix} A_1 & 0 & 0 \\ \vdots & \ddots & \vdots \\ 0 & 0 & A_\lambda \end{pmatrix} \qquad (10)$$

Measurement vector y can be generated from (1) by vectorizing the 3D ARP data into $x \in \mathbb{C}^{n \times 1}$, where the total size of the data is $n=n_\theta n_\varphi n_\lambda$. The complex values are converted to real values using (6) and (7), and sparse ARP coefficients can be recovered from (3). For noisy data, or data that is not completely sparse, the equality constraint can be relaxed to an inequality constraint $$\min\|s\|_1 \text{ subject to } \|A\Psi s - y\|_2 \leq \varepsilon, \qquad (11)$$

where $\varepsilon$ is a user defined constant.

Rotating Spherical Measurements

In the previous system design, a large number of transmitter antennas and transmitters ($n_\theta \times n_\varphi$) are required to create the compressive samples. This number can be reduce by randomly distributing a fraction of these transmitters, $r_n$, around the AUT 102, and then rotating the AUT 102 between measurements. For higher resolutions the total number of transmitters can be reduced by factors as high as $r_n = 1/64$ without degrading performance. Even in the non-rotating case, activating only a fraction of transmitters at random locations performs well and reduces algorithm complexity.

Denote matrix $P \in \mathbb{Z}^{n_\theta \times n_\varphi}$ indicating the initial positions of the transmitting test antennas, where $p_{\theta_\varphi}=1$ if the transmitter antenna is present, and $p_{\theta_\varphi}=0$ if absent. $\theta=1, \ldots, n_\theta$ and $\varphi=1, \ldots, n_\varphi$ are indices of P. The rotation of the AUT is modeled as a row-wise, downward, circular shifting of P, using shifting matrix $H \in \mathbb{Z}^{n_\theta \times n_\theta}$ with rows $$h_\theta^T = \begin{cases} e_{n_\theta}^T, & \theta = 1 \\ e_{\theta-1}^T, & \theta \neq 1 \end{cases} \qquad (12)$$

Figure 4:
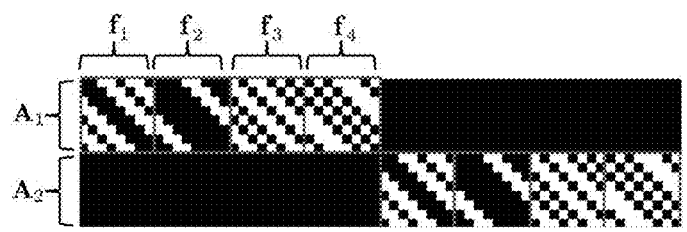
FIG. 4 is a visualization of an exemplary sensing matrix for the rotating spherical arrangement of FIG. 3.

For one wavelength, the sensing matrix is $$A_\lambda = \begin{pmatrix} vec(H^{\alpha-1} P_\alpha \odot F_\alpha)^T \\ \vdots \\ vec(H^{\beta-1} P_\beta \odot F_\beta)^T \end{pmatrix} \lambda = 1, \ldots, n_\lambda \qquad (13)$$

where $\odot$ signifies an element-wise operation and $\alpha$ and $\beta$ are as in (9). The full sensing matrix is once again given by (10). Here the transmitters' signals are changed at each measurement, but they also can be changed once after each complete revolution of the AUT with little impact on performance. FIG. 4 is a visualization of the sensing matrix (A) with $n_\theta=8$, $n_\varphi=4$, $n_\lambda=2$, $r_n=\frac{1}{2}$, and m=16; with all nonzero values set to 1 for the purpose of the illustration. The 4 columns of $F_1$ are labeled, vectorized as the rows of $A_1$, with the columns rotating with each measurement.

Independent Circular Measurements

Figure 5:
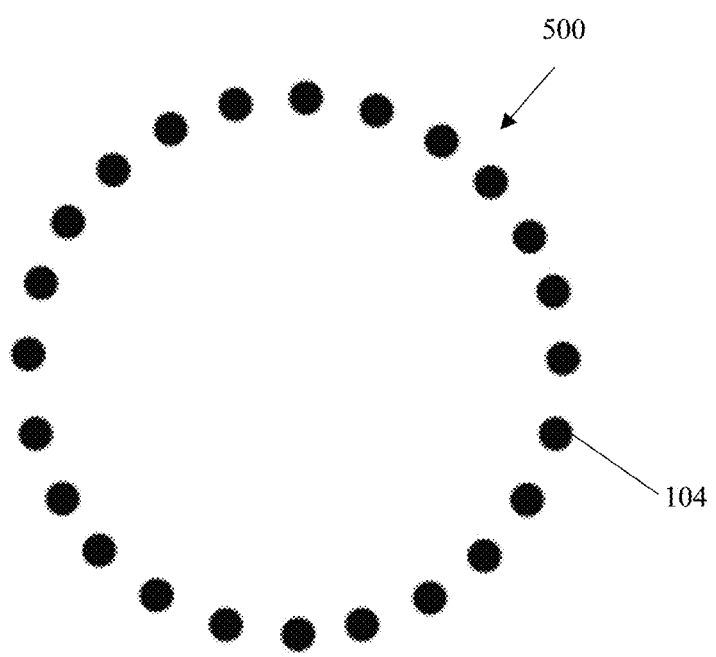
FIG. 5 is a schematic drawing of an embodiment of the invention where a plurality of test transmitter antennas are arranged in a ring about the AUT.

The number of transmitters and transmitting antennas can also be reduced by using a circular ring of transmitters along $\theta$ to create compressed measurements, and then rotating the AUT 102 along $\varphi$ to capture the full ARP. FIG. 5 depicts a schematic of the circular array 500 of test antennas 104. Matrix $F_k$ is replaced by vector $f_k \in \mathbb{C}^{n_\theta \times 1}$, with $$m_\theta = \frac{m}{n_\varphi n_\lambda} \qquad (14)$$

measurements for each angle of $\varphi$. Each $A_\lambda$ now has its own submatrices representing the measurements at each $\varphi$ angle $$B_{\ell\lambda} = \begin{pmatrix} f_\alpha^T \\ \vdots \\ f_\beta^T \end{pmatrix} \ell = 1, \ldots, n_\varphi \ \lambda = 1, \ldots, n_\lambda \qquad (15)$$

$$\alpha = m_\theta n_\varphi (\lambda - 1) + m_\theta(\ell - 1) + 1 \qquad (16)$$

$$\beta = m_\theta n_\varphi (\lambda - 1) + m_\theta \ell \qquad (17)$$

where $\lambda$ identifies the wavelength and $\ell$ identifies the $\varphi$ angle. This places $B\ell_\lambda$ as the $\ell^{th}$ submatrix in $A_\lambda$. $A_\lambda$ now also has a block diagonal structure $$A_\lambda = \begin{pmatrix} B_{1\lambda}^T & 0 & 0 \\ \vdots & \ddots & \vdots \\ 0 & 0 & B_{n_\varphi \lambda}^T \end{pmatrix} \qquad (18)$$

with the final sensing matrix given by (10).

Rotating Circular Measurements

Figure 6:
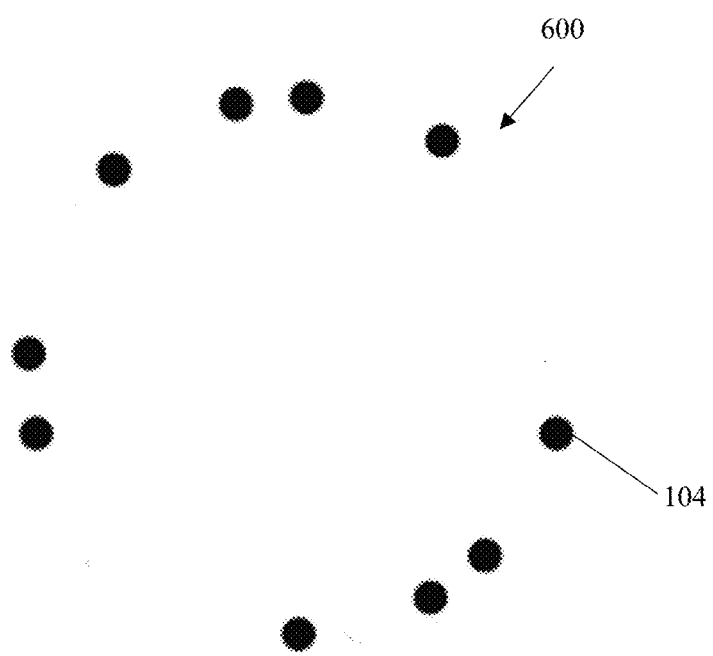
FIG. 6 is a schematic drawing of an embodiment of the invention where a plurality of test transmitter antennas are arranged in a sparse ring about the AUT.

As in the spherical case, if the AUT 102 is rotated $m_\theta$ times in $\theta$, in addition to the rotations in $\varphi$, only a fraction $r_n$ of the transmitters and transmitting antennas are needed. FIG. 6 depicts a schematic of a sparse circular array 600 of test antennas 104.

Instead of encoding the rotation into matrix P, the rotation is now represented by vector $P \in \mathbb{Z}^{n_\theta \times 1}$, with $$B_{\ell\lambda} = \begin{pmatrix} (H^{\alpha-1} p \odot f_\alpha)^T \\ \vdots \\ (H^{\beta-1} p \odot f_\beta)^T \end{pmatrix} \quad (19)$$

using the same definitions of $\ell$, $\lambda$, $\alpha$, and $\beta$ as in (15-17). $A_\lambda$ and A are then formed using (18) and (10) respectively.

Figure 7:
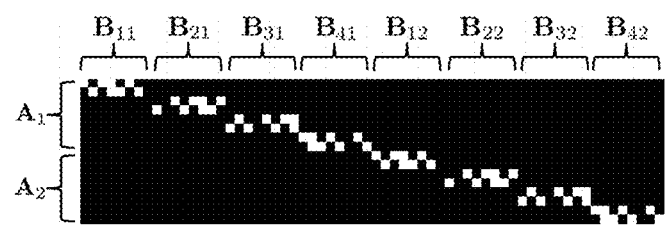
FIG. 7 is a visualization of an exemplary sensing matrix for the rotating circular arrangement of FIG. 6.

FIG. 7 is a visualization of the sensing matrix (A) with $n_\theta=8$, $n_\varphi=4$, $n_\lambda=2$, $r_n=\frac{1}{2}$, and m=16; with all non-zero value set to 1. The labeled $B_{\ell\lambda} \in \mathbb{C}^{2\times 8}$ submatrices are composed of the antenna placements f that circularly shift to the right with each measurement.

Sensing Matrix Optimization

Equation (5) states that the number of measurements required to accurately recover data from compressive samples is proportional to the square of the coherence of the sensing matrix. Although random elements generally provide low coherence, optimization methods can be used to lower this coherence further, thereby increasing CS performance. Starting with $D=A\Psi$ for only one wavelength, the columns are normalized as $d_n=d/\|d\|_2$ to produce $D_n$. The coherence values $\mu_{ij}$ are the off diagonal elements of the Gram matrix, $G=D_n^T D_n$. Coherence values greater than the theoretical minimum $$\mu_{min} = \sqrt{\frac{n-m}{m(n-1)}} \quad (20)$$

can be lowered closer to $\mu_{min}$ by $$\mu'_{ij} = \gamma\mu_{ij} + \text{sign}(\mu_{ij})(1-\gamma)\mu_{min}, \; 0<\gamma<1 \quad (21)$$

to create a new G' with lower coherence. Finally, QR factorization is used to extract D' and finally A' and G'. The process is repeated, reducing μ with each iteration. The final optimized A' can then be converted to real values with (6) and used across all of the wavelengths for every $A_\lambda$ since wavelengths are independent in the measurement process. This method cannot be directly applied to the rotating architectures since A has a predefined structure. A form of binary search with other metrics than coherence might be applicable to these cases.

Simulation Results

Figure 8:
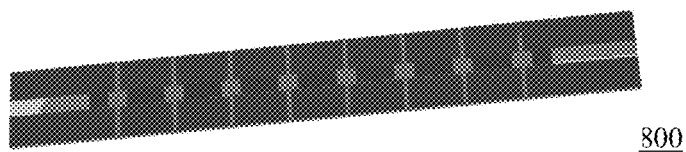
FIG. 8 depicts an AUT model used to simulate embodiments of the invention.
Figure 9:
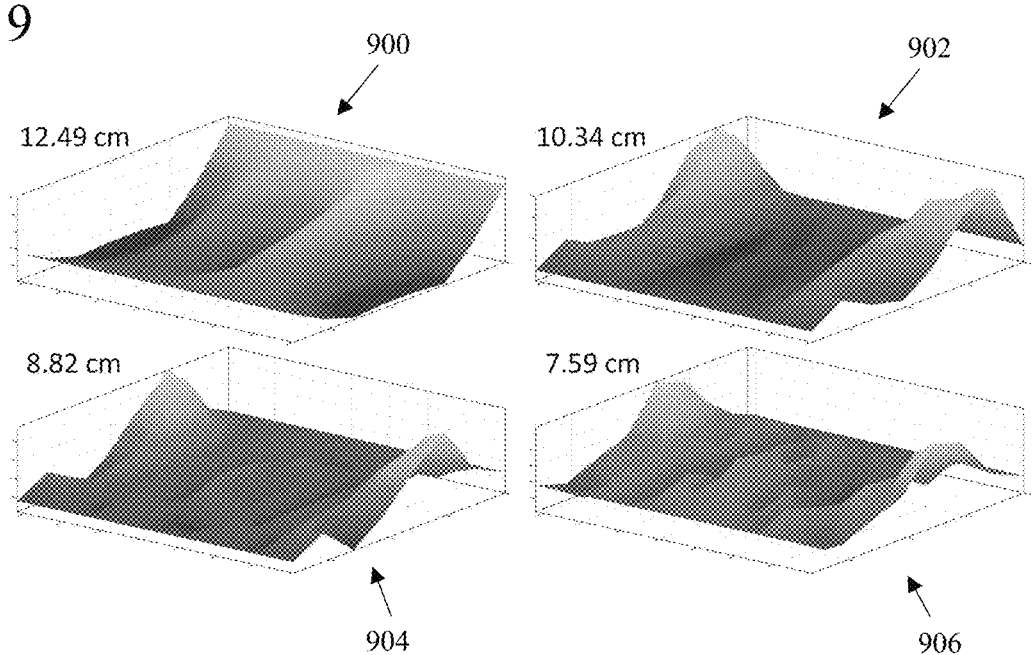
FIG. 9 depicts the ARP used in the simulation at four wavelengths.
Figure 10:
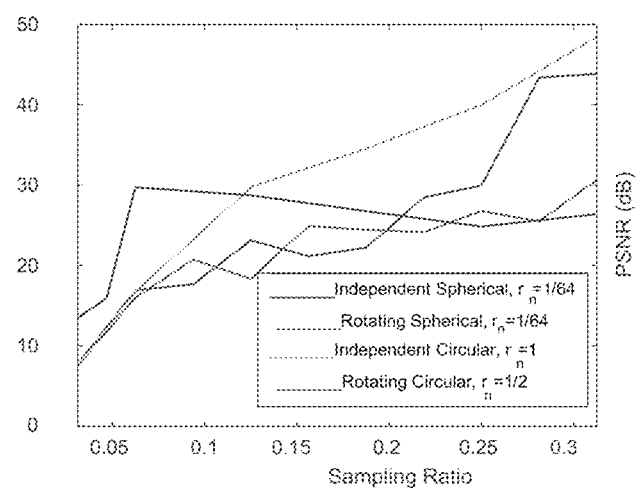
FIG. 10 is a plot of peak signal to noise ratio found for each of the four embodiments in FIGS. 2, 3, 5 and 6.

The four CS architectures (using test antenna arrays: spherical, sparse spherical, circular, sparse circular) outlined above were simulated over a range of sampling ratios. The AUT used in the simulation is a leaky wave antenna based on a composite right left-handed transmission line. The ARP was generated using openEMS and used as test data. The AUT model is shown in FIG. 8, with the ARP of four wavelengths shown in FIG. 9—900 shows the ARP at a 12.49 cm wavelength, 902 shows the ARP at a 10.34 cm wavelength, 904 shows the ARP at an 8.82 cm wavelength and 906 shows the ARP at a 7.59 cm wavelength. Observe that the ARP changes significantly with wavelength, although the gradual changes leave the 3D data relatively sparse. Simulations used a resolution of $n_\theta=64$, $n_\varphi=32$, and $n_\lambda=32$ spanning a range of 12.49 cm to 7.59 cm (2.4 GHz to 3.95 GHz). With this amount of data, the sensing matrix can be very large. Using a sampling ratio of 0.25, gives an $A \in \mathbb{R}^{16384 \times 16384}$, which can consume up to 8.59 GB of storage when using double precision floating point numbers.

Due to the block diagonal structure of A for these architectures, many of the elements are zero, and calculations can be accelerated by taking advantage of the sparsity of the sensing matrix. As mentioned above, this sparsity can be increased not only by removing transmitters in the rotating cases, but also by randomly disabling a number of the transmitters in the independent scenarios. The fraction of transmitters used for each case, $r_n$, is listed in the plot legend of FIG. 10. The real and imaginary components of the sensing matrix were taken from N(0,1), and ε was set to $10^{-3}\|y'\|_2$. The discrete Fourier transform was used as the sparse basis. For each architecture, for each sampling ratio, the results of four simulations were averaged to produce the plots in FIG. 10. Results range from the rotating circular architecture achieving a peak signal to noise ratio (PSNR) of 30 dB using a sampling ratio of only $r_m=0.0625$, to the rotating spherical architecture requiring $r_m=0.3125$ to achieve 30 dB, which is a considerable savings compared to the total data size.

Figure 11:
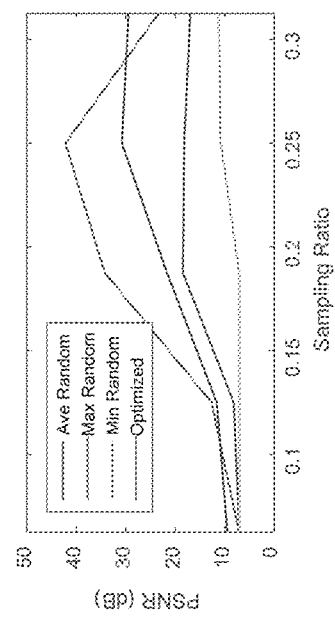
FIG. 11 is a plot of peak signal to noise ratio found for the embodiment in FIG. 2 and a sensing matrix optimization technique is applied.

The sensing matrix optimization algorithm was also verified in simulation. FIG. 11 shows the results of a small test case of the independent circular (IS) scenario with $n_\theta=16$, $n_\varphi=8$, and $n_\lambda=8$ across a range of sampling ratios. For comparison, five random sensing matrices were simulated, with the maximum, minimum, and average PSNR of the recovered patterns plotted. On average, the optimized A performed better than the random ones, although there were random matrices that did perform better than the optimized matrix. It is likely that by chance these random matrices were able to capture the sparse coefficients of the test data well, but would not perform as well as the optimized system for other data sets.

Comparison to Traditional Techniques

In order to appreciate the benefits of CS, traditional ARP measurement techniques are compared to CS techniques. Table I shows a basic comparison of three architectures using traditional sampling: a sphere of transmitters (TS), a circle of transmitters (TC), and a transmitter at a single point (TP). The term "transmitters" refers to transmitting test antennas. Details such as whether or not each antenna has a separate transmitter, or if there is one transmitter and a multiplexing scheme, is not considered here. $n_\lambda$ is excluded from these values, since it is assumed that multiple wavelengths can be captured simultaneously. Using traditional sampling, the total number of samples taken is always the same, dictated by the Nyquist criteria. $t_m$ denotes movement time and $t_s$ sampling time, which is typically much smaller than $t_m$. The comparison among traditional sampling architectures is straightforward, increasing the number of transmitters decreases the amount of movement of the AUT, thereby decreasing total measurement time.

Table II shows a comparison of the CS architectures: independent spherical (IS), rotating spherical (RS), independent circular (IC), and rotating circular (RC) measurements. The row headings are abbreviated versions of the headings in Table I. The fraction of transmitters used, $r_n$, varies depending on the architecture. The sampling ratio, $r_m$, also depends on the architecture, and should be set to meet a given performance threshold. For simplicity, when deriving the sensing matrix of RS, it was assumed that the AUT rotated between each measurement. But it is equivalent for $n_\varphi r_m$ measurements to be taken at each position, only moving a total of $n_\theta$ times. The same reasoning explains the $n_\varphi$ used as the number of movements for IC.

The varying values of $r_n$ and $r_{n'}$, along with the added complexity of rotation, makes analysis of the CS methods more complicated than the traditional sampling methods. To facilitate analysis, example values for Tables I and II were calculated and displayed in Table III. The calculations used the simulation parameters from section VI, $t_m$=3.0 s and $t_s$=0.1 s, and a performance threshold of approximately 30 dB. Using the results in FIG. 10, $r_m$ was set to 0.25, 0.3125, 0.125, and 0.0625 for IS, RS, IC, and RC respectively. Although these results only reflect a single antenna pattern, the pattern is fairly complex and should represent a fair test case for evaluation. Further research is necessary to determine appropriate values of $r_m$ for various antenna types. The fastest CS method, IS, is about 4 times faster than the fastest traditional method using the same number of transmitters. The lowest cost method is the traditional, single transmitter system, but it also has by far the longest measurement time. The next least expensive methods are RS and RC, with RS having the shortest measurement time for this example, beating the comparable traditional method TC in both cost and measurement time. IC is more expensive than RS, but is also more than twice as fast, making it a preferred choice when speed outweighs cost considerations. This high-level comparison clearly demonstrates the advantage of using CS for ARP measurement.

While the foregoing is directed to embodiments of the present invention, other and further embodiments of the invention may be devised without departing from the basic scope thereof, and the scope thereof is determined by the claims that follow. Additional details of this invention may be found in a slide presentation titled "Compressive Antenna Pattern Sensing", and a follow-up article titled "Antenna Radiation Pattern Compressive Sensing" by Michael L. Don and Gonzalo R. Arce that was presented at MILCOM 2018—2018 IEEE Military Communications Conference and added to IEEE Xplore Jan. 3, 2019, both of which are hereby incorporated by reference herein.

The invention claimed is:

1. An apparatus for measuring antenna radiation patterns comprising:
    an array of test antennas;
    an antenna under test located proximate to the array of test antennas;
    a compressive sensing processor coupled to the antenna under test and the array of test antennas to control signals emitted and received by the antenna under test and the array of test antennas, processing the received signals using compressive sensing and producing an antenna radiation pattern for the antenna under test
    wherein the array of test antennas is a spherical array.

2. The apparatus of claim 1 where the array of test antennas is a sparse spherical array.

3. The apparatus of claim 1 where the antenna under test is a transmitting antenna and the array of test antennas are receiving antennas, or the antenna under test is a receiving antenna and the array of test antennas are transmitting antennas.

4. The apparatus of claim 1 where the received signal has sparse data content.

5. The apparatus of claim 1 wherein the processing using compressive sensing is optimized by reducing coherence of a sensing matrix.

6. A method for measuring antenna radiation patterns comprising:
    a) positioning an antenna under test proximate to an array of test antennas;
    b) controlling signals emitted and received by the antenna under test and the array of test antennas;
    c) processing the received signals using compressive sensing; and
    d) producing an antenna radiation pattern for the antenna under test from the processed received signals
    wherein the array of test antennas is a spherical array.

7. The method of claim 6 where the array of test antennas is a sparse spherical array and the method further comprises rotating the antenna under test after d) and repeating b), c) and d).

8. The method of claim 6 where the array of test antennas is a sparse circular array and the method further comprises rotating the antenna under test after d) along two axes and repeating b), c) and d).

9. The method of claim 6 where the antenna under test is a transmitting antenna and the array of test antennas are receiving antennas, or the antenna under test is a receiving antenna and the array of test antennas are transmitting antennas.

10. The method of claim 6 where the received signal has sparse data content.

11. The method of claim 6 wherein processing using compressive sensing further comprises optimizing the processing by reducing coherence of a sensing matrix.

12. A method for measuring antenna radiation patterns using the apparatus of claim 1.

13. An apparatus for measuring antenna radiation patterns using the method of claim 6.

14. An apparatus for measuring antenna radiation patterns comprising:
    an array of test antennas;
    an antenna under test located proximate to the array of test antennas;
    a compressive sensing processor coupled to the antenna under test and the array of test antennas to control signals emitted and received by the antenna under test and the array of test antennas, processing the received signals using compressive sensing and producing an antenna radiation pattern for the antenna under test
    wherein the array of test antennas is a circular array.

15. The apparatus of claim 14 where the array of test antennas is a sparse circular array.

16. The apparatus of claim 14 where the antenna under test is a transmitting antenna and the array of test antennas are receiving antennas, or the antenna under test is a receiving antenna and the array of test antennas are transmitting antennas.

17. The apparatus of claim 14 where the received signal has sparse data content.

18. The apparatus of claim 14 wherein the processing using compressive sensing is optimized by reducing coherence of a sensing matrix.

19. A method for measuring antenna radiation patterns comprising:
    a) positioning an antenna under test proximate to an array of test antennas;
    b) controlling signals emitted and received by the antenna under test and the array of test antennas;
    c) processing the received signals using compressive sensing; and
    d) producing an antenna radiation pattern for the antenna under test from the processed received signals
    wherein the array of test antennas is a circular array.

20. The method of claim 19 where the array of test antennas is a circular array and the method further comprises rotating the antenna under test after d) and repeating b), c) and d).

21. The method of claim 19 where the array of test antennas is a sparse circular array and the method further comprises rotating the antenna under test after d) along two-axes and repeating b), c) and d).

22. The method of claim 19 where the antenna under test is a transmitting antenna and the array of test antennas are receiving antennas, or the antenna under test is a receiving antenna and the array of test antennas are transmitting antennas.

23. The method of claim 19 where the received signal has sparse data content.

24. The method of claim 19 wherein processing using compressive sensing further comprises optimizing the processing by reducing coherence of a sensing matrix.

25. A method for measuring antenna radiation patterns using the apparatus of claim 15.

26. An apparatus for measuring antenna radiation patterns using the method of claim 19.

* * * * *